(12) United States Patent
Suzuki et al.

(10) Patent No.: US 10,869,383 B2
(45) Date of Patent: *Dec. 15, 2020

(54) ELECTRONIC APPARATUS

(71) Applicant: TOSHIBA MEMORY CORPORATION, Tokyo (JP)

(72) Inventors: Akitoshi Suzuki, Kanagawa (JP); Yoshiharu Matsuda, Kanagawa (JP); Kazuhiro Yoshida, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/385,186

(22) Filed: Apr. 16, 2019

(65) Prior Publication Data

US 2019/0246489 A1 Aug. 8, 2019

Related U.S. Application Data

(63) Continuation of application No. 15/695,991, filed on Sep. 5, 2017, now Pat. No. 10,314,160.

(30) Foreign Application Priority Data

Mar. 15, 2017 (JP) .................................. 2017-049393

(51) Int. Cl.
*H05K 1/02* (2006.01)
*G11B 33/14* (2006.01)
(Continued)

(52) U.S. Cl.
CPC .......... *H05K 1/0203* (2013.01); *G06F 1/187* (2013.01); *G11B 33/142* (2013.01); *H05K 1/18* (2013.01);
(Continued)

(58) Field of Classification Search
CPC ........... H05K 7/20163; H05K 7/20918; G11B 33/142–146
See application file for complete search history.

(56) References Cited

U.S. PATENT DOCUMENTS 5,218,516 A * 6/1993 Collins .............. H05K 7/20545
361/715
5,276,584 A * 1/1994 Collins .............. H05K 7/20545
165/185
(Continued)

FOREIGN PATENT DOCUMENTS

JP 2012-146828 A 8/2012
JP 2014-049536 A 3/2014
(Continued)

*Primary Examiner* — Robert J Hoffberg
(74) *Attorney, Agent, or Firm* — Foley & Lardner LLP

(57) ABSTRACT

An electronic apparatus includes a top plate, a bottom plate provided under the top plate, a circuit board provided between the top plate and the bottom plate, an electronic component disposed on the circuit board, and an intermediate plate provided between the top plate and the circuit board. The intermediate plate is configured to provide a clearance between the top plate and intermediate plate, or between the circuit board and the intermediate plate. The intermediate plate is further configured to allow an air flow from a first end portion to a second end portion of the top plate.

14 Claims, 5 Drawing Sheets

(51) Int. Cl.
  *H05K 7/20* (2006.01)
  *H05K 1/18* (2006.01)
  *H05K 5/00* (2006.01)
  *G06F 1/18* (2006.01)
  *G06F 1/20* (2006.01)

(52) U.S. Cl.
  CPC ....... *H05K 5/0008* (2013.01); *H05K 7/20009* (2013.01); *H05K 7/20163* (2013.01); *G06F 1/20* (2013.01); *H05K 2201/10015* (2013.01); *H05K 2201/10037* (2013.01)

(56) References Cited

U.S. PATENT DOCUMENTS

| | | | |
|---|---|---|---|
| 5,971,566 A * | 10/1999 | Tani | H05K 7/20972 |
| | | | 313/46 |
| 6,567,271 B2 | 5/2003 | Stone | |
| 7,180,736 B2 * | 2/2007 | Glovatsky | H05K 7/1434 |
| | | | 361/688 |
| 7,391,617 B2 | 6/2008 | Veh | |
| 7,417,859 B2 * | 8/2008 | Bae | H05K 7/2099 |
| | | | 361/710 |
| 7,447,021 B2 | 11/2008 | Chen | |
| 7,450,377 B2 | 11/2008 | Matsumoto | |
| 7,667,964 B2 | 2/2010 | Kang | |
| 7,764,514 B2 | 7/2010 | Mongia | |
| 7,990,722 B2 | 8/2011 | Cao | |
| 8,451,600 B1 | 5/2013 | Ross | |
| 8,537,555 B2 | 9/2013 | Huang | |
| 8,787,018 B2 * | 7/2014 | Nagano | H01G 2/10 |
| | | | 361/678 |
| 9,363,931 B2 * | 6/2016 | Kaefer | H05K 7/20972 |
| 9,408,330 B2 * | 8/2016 | Cruz | G06F 1/20 |
| 9,443,560 B2 | 9/2016 | Szeremeta | |
| 9,600,042 B2 | 3/2017 | Tsunoda | |
| 9,694,451 B1 | 7/2017 | Ross | |
| 9,723,758 B2 * | 8/2017 | Kwon | H05K 7/20145 |
| 9,877,415 B2 | 1/2018 | Szeremeta | |
| 9,980,414 B2 * | 5/2018 | Hebert | H05K 7/20918 |
| 10,085,364 B2 | 9/2018 | Voss | |
| 10,314,160 B2 * | 6/2019 | Suzuki | H05K 1/0203 |
| 10,512,182 B2 * | 12/2019 | Suzuki | H05K 5/0269 |
| 10,524,383 B2 * | 12/2019 | Yoshikawa | H02M 7/003 |
| 10,524,390 B2 * | 12/2019 | Suzuki | H05K 5/006 |
| 2007/0258199 A1 | 11/2007 | Jeong | |
| 2008/0244630 A1 | 10/2008 | Van | |
| 2010/0053897 A1 | 3/2010 | Kusaka | |
| 2013/0050942 A1 | 2/2013 | Konishi | |
| 2015/0327353 A1 | 11/2015 | Dickover | |
| 2016/0086917 A1 | 3/2016 | Byun | |
| 2017/0303437 A1 * | 10/2017 | Kwon | G11B 33/128 |
| 2017/0374766 A1 | 12/2017 | Zebian | |
| 2018/0270991 A1 | 9/2018 | Suzuki | |
| 2019/0373762 A1 * | 12/2019 | Moser | H05K 7/209 |

FOREIGN PATENT DOCUMENTS

| | | |
|---|---|---|
| JP | 2015-135852 A | 7/2015 |
| JP | 6024297 B2 | 11/2016 |

* cited by examiner

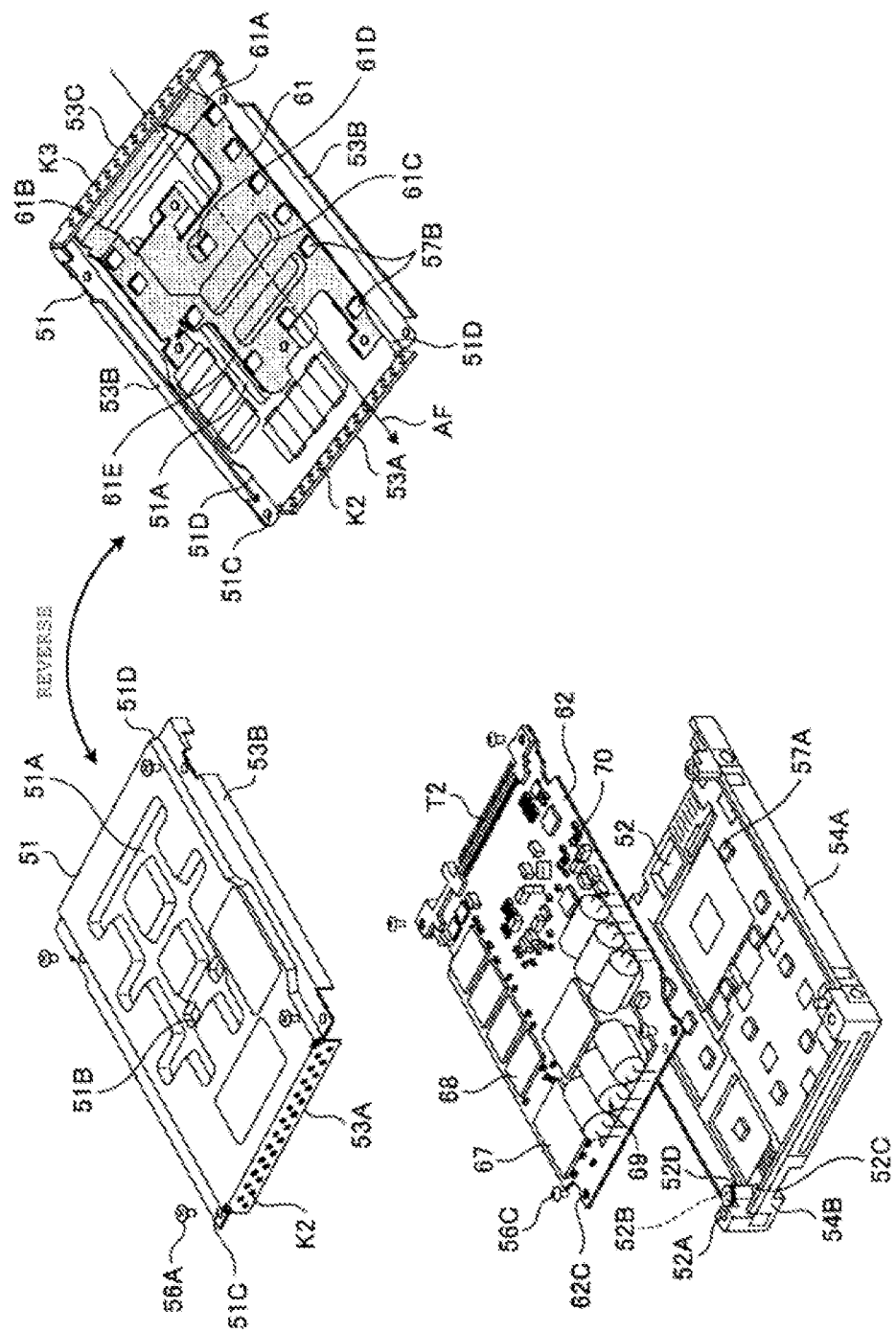

ELECTRONIC APPARATUS

CROSS-REFERENCE TO RELATED APPLICATION

This application is a continuation of U.S. application Ser. No. 15/695,991, filed Sep. 5, 2017, which claims the benefit of and priority to Japanese Patent Application No. 2017-049393, filed Mar. 15, 2017 the entire contents of which are incorporated herein by reference.

FIELD

Embodiments described herein relate generally to an electronic apparatus.

BACKGROUND

An electronic apparatus can be configured to provide for heat dissipation by releasing heat generated from an electronic component to a casing. When a space between the electronic component and the casing is large, it may be difficult to release the heat generated from the electronic component to the casing, or a shock resistance may be poor due to the spacing.

DESCRIPTION OF THE DRAWINGS

FIG. 5 is an exploded perspective view illustrating an example of a configuration of the electronic apparatus shown in FIG. 4 when one circuit board is implemented in the electronic apparatus.

DETAILED DESCRIPTION

Some embodiments provide for an electronic apparatus capable of efficiently releasing heat generated in an electronic component while improving an impact or shock resistance even when there is a large space between the electronic component and a casing.

In general, according to one aspect, an electronic apparatus includes a top plate, a bottom plate provided under the top plate, a circuit board provided between the top plate and the bottom plate, an electronic component disposed on the circuit board, and an intermediate plate provided between the top plate and the circuit board. The intermediate plate is configured to provide a clearance between the top plate and intermediate plate, or between the circuit board and the intermediate plate. The intermediate plate is further configured to allow an air flow from a first end portion to a second end portion of the top plate.

Electronic apparatuses according to embodiments will be described hereinafter in detail with reference to the accompanying drawings. It is noted that the embodiments described below are examples, and are not intended to limit the present disclosure.

(First Aspect)

Figure 1:
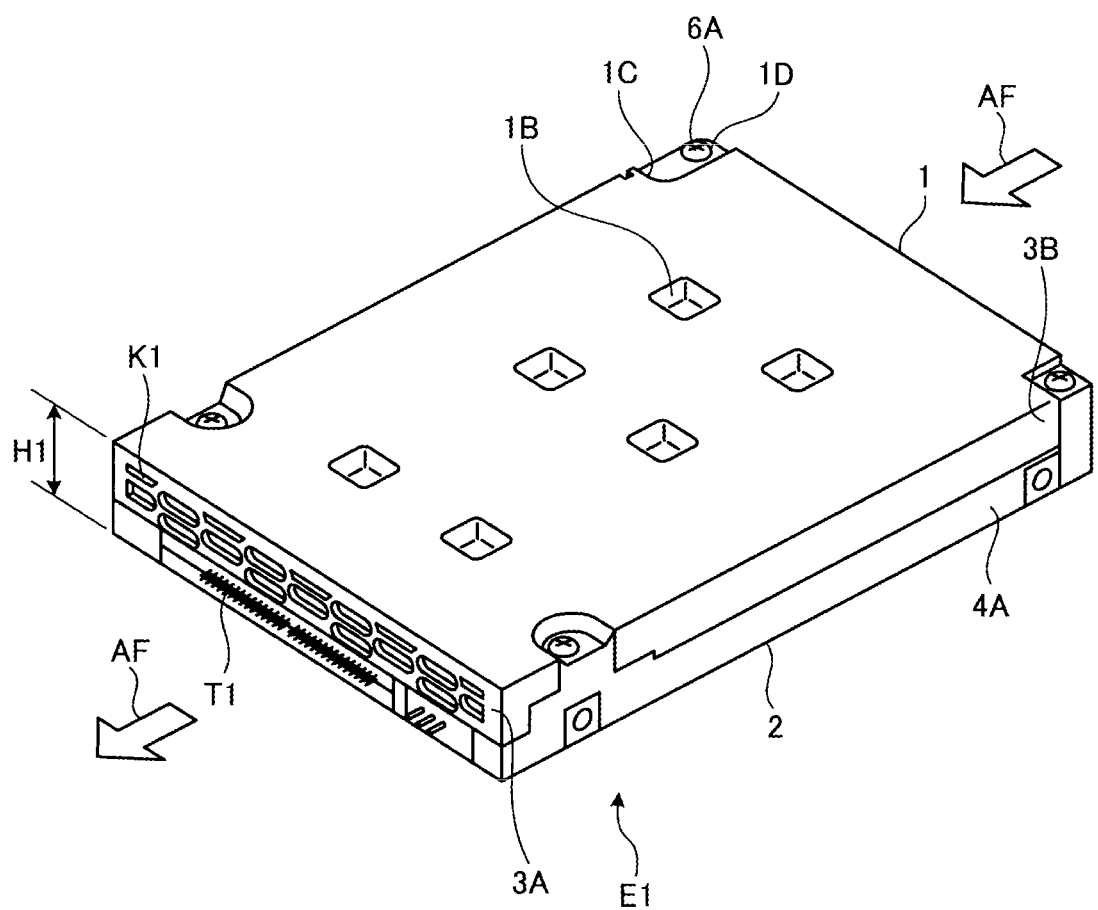
FIG. 1 is a perspective view illustrating a schematic configuration of some embodiments of an electronic apparatus viewed from a top plate side according to a first aspect.
Figure 2:
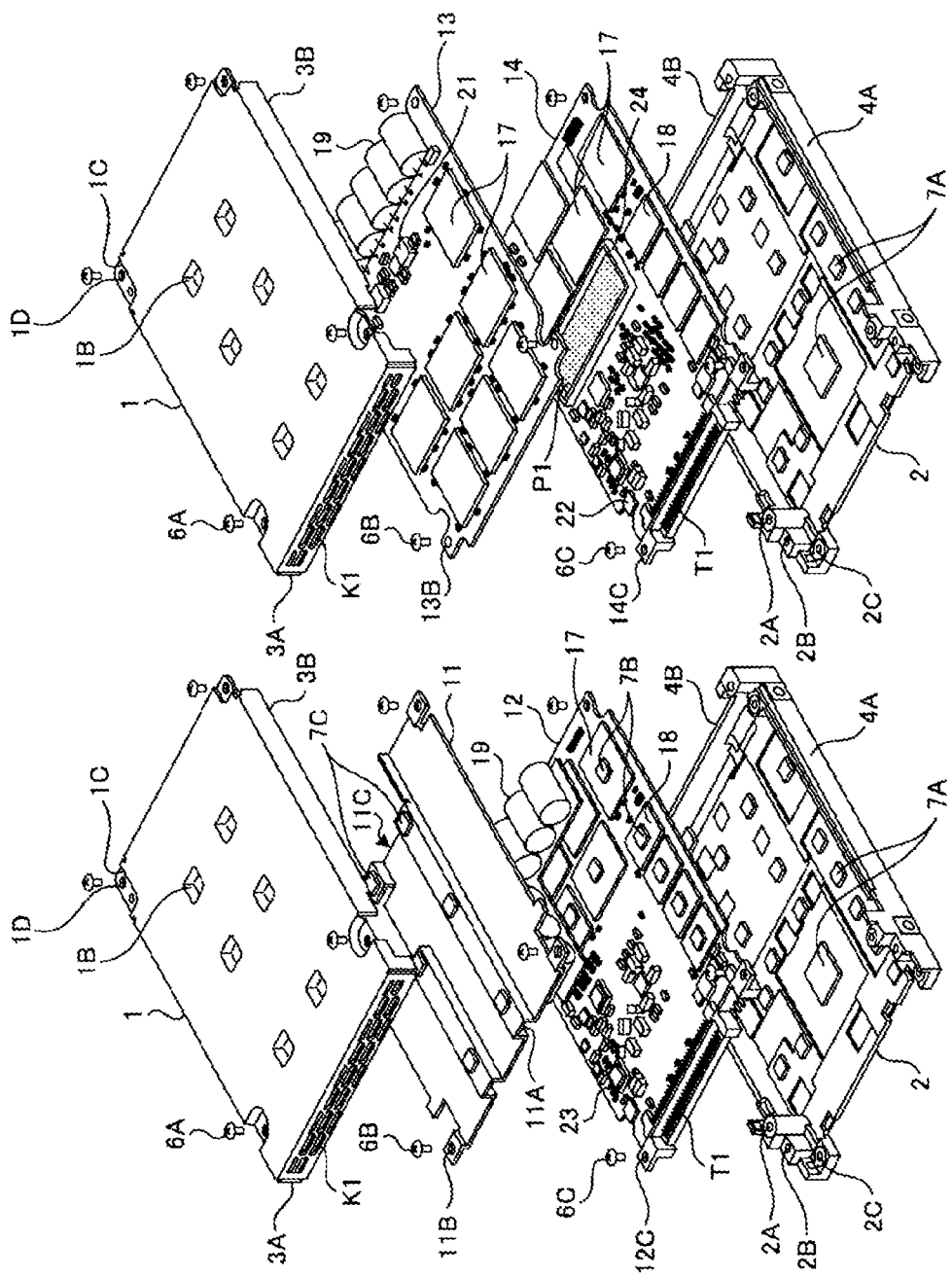
FIG. 2A is an exploded perspective view illustrating an example of a configuration of the electronic apparatus shown in FIG. 1 when one circuit board is implemented in the electronic apparatus.
FIG. 2B is an exploded perspective view illustrating an example of a configuration of the electronic apparatus shown in FIG. 1 when two circuit boards are implemented in the electronic apparatus.

FIG. 1 is a perspective view illustrating some embodiments of a schematic configuration of an electronic apparatus viewed from a top plate side according to a first aspect. FIG. 2A is an exploded perspective view illustrating an example of a configuration of the electronic apparatus shown in FIG. 1 when one circuit board is implemented in the electronic apparatus. FIG. 2B is an exploded perspective view illustrating an example of a configuration of the electronic apparatus shown in FIG. 1 when two circuit boards are implemented in the electronic apparatus. In the embodiments described below, a solid state drive (SSD) will be described as the electronic apparatus by way of example; however, other embodiments may be implemented with other electronic apparatuses. Further, in embodiments described below, a configuration that includes one or two circuit boards in the electronic apparatus will be described by way of example; however, some other embodiments may implement more than two circuit boards.

As shown in FIG. 1, an electronic apparatus E1 includes a top plate 1 and a bottom plate 2. As shown in FIG. 2B, circuit boards 13 and 14 can be provided between the top plate 1 and the bottom plate 2. Alternatively, as shown in FIG. 2A, an intermediate plate 11 and a circuit board 12 can be provided between the top plate 1 and the bottom plate 2. The intermediate plate 11 can be disposed at a position of the circuit board 13 shown in FIG. 2B (e.g. the intermediate plate 11 can be implemented in place of the circuit board 13). A heat dissipation performance for releasing heat in the electronic apparatus E1 and/or a shock-absorbing performance for absorbing shock applied to the electronic apparatus E1 can be improved by implementing the intermediate plate 11.

As shown in FIG. 1, FIG. 2A and FIG. 2B, a side plate 3A is provided on a front end of the top plate 1, and side plates 3B are provided on right and left ends of the top plate 1, respectively. Vent holes K1 are provided in the side plate 3A. Side plates 4A are provided on right and left ends of the bottom plate 2, respectively, and a side plate 4B is provided on a rear end of the bottom plate 2.

With the configuration shown in FIG. 2B, the top plate 1, the bottom plate 2, and the side plates 3A, 3B, 4A, and 4B can surround the circuit boards 13 and 14. With the configuration shown in FIG. 2A, the top plate 1, the bottom plate 2, and the side plates 3A, 3B, 4A, and 4B can surround the intermediate plate 11 and the circuit board 12.

Recess portions 1B and 1C are also provided, and are defined by the top plate 1. One or more recess portions 1B can be provided at an inner portion of the top plate 1. One or more recess portions 1C can be provided at outer edge portions of the top plate 1. With the configuration shown in FIG. 2B, the recess portions 1B can be used as part of a heat dissipation path of heat generated in the circuit boards 13 and 14. With the configuration shown in FIG. 2A, the recess portions 1B can be used as part of a heat dissipation path of heat generated in the circuit board 12.

Furthermore, a through-hole 1D is provided in each recess portion 1C. A screw 6A can be inserted into the through-hole 1D.

A height H1 of the electronic apparatus E1 can be defined by a vertical distance from a bottom surface of the bottom plate 2 to a top surface of the top plate 1. The height H1 of the electronic apparatus E1 can comply with small form factor (SFF) standards.

As shown in FIG. 1, an air flow AF flows into the electronic apparatus E1 and flows out from an interior of the electronic apparatus E1 via the vent holes K1, whereby it is possible to efficiently cool the interior of the electronic apparatus E1.

As shown in FIG. 2A and FIG. 2B, screw holes 2A, 2B and 2C are provided in the bottom plate 2. The screw holes 2A through 2C can be disposed at each of four corners of the bottom plate 2. A formation surface of each respective screw hole 2A can be set higher than that of each corresponding screw hole 2B (e.g. the screw hole 2B closest to the respective screw hole 2A), and the formation surface of each screw hole 2B can be set higher than that of each screw hole 2C. As used herein, the term "formation surface" refers to a surface that defines an opening of a hole, trench or via. The screws 6A can be respectively inserted into the screw holes 2A. A screw 6B can be inserted into each screw hole 2B. A screw 6C can be inserted into each screw hole 2C. In other embodiments, a fastener other than a screw may be implemented in place of any or all of the screws 6A, 6B and 6C.

As shown in FIG. 2B, a negative-AND (NAND) package 17 is mounted on each of the circuit boards 13 and 14. A semiconductor chip including a NAND flash memory (hereinafter, referred to as "NAND memory") disposed thereon is encapsulated in the NAND package 17. One or more NAND packages 17 can be mounted on both top and bottom surfaces of each of the circuit boards 13 and 14.

Further, an electronic component 21 and a capacitor 19 are mounted on the top surface of the circuit board 13. A connector (not shown) provided with upright pins is mounted on the bottom surface of the circuit board 13. The capacitor 19 can supply electric power for transferring data stored in a dynamic random access memory (DRAM) to the NAND memory when an external power supply of the electronic apparatus E1 is disconnected. A battery may be mounted on the top surface of the circuit board 13 as an alternative to the capacitor 19. A DRAM package 18, an electronic component 22, and a connector 24 are mounted on the top surface of the circuit board 14. Pin holes P1 are provided in the connector 24. A connector T1 is mounted at a front portion of the circuit board 14. A semiconductor chip including a DRAM disposed thereon is encapsulated in the DRAM package 18. The electronic components 21 and 22 can constitute at least a portion of a power supply circuit or the like. A controller package (not shown) is mounted on the bottom surface of the circuit board 14. A semiconductor chip including a controller disposed thereon is encapsulated in the controller package.

The controller can operate as an interface between a host (not shown) and the NAND memory when read data or write data is communicated therebetween. For example, the controller can perform, for example, read data or write data buffering, an error correction code (ECC) process, a wear leveling process, and randomization process. The wear leveling process is a process for preventing concentration of writing data on a specific block in the NAND memory. The randomization process is a process for making it difficult to cause inter-cell interference by preventing data written to the same block in the NAND memory from including periodicity.

The NAND package 17, the DRAM package 18, and the controller package each may include any of, for example, a quad flat package (QFP), a ball grid array (BGA), a chip on board (COB), and a chip size package (CSP). The NAND package 17, the DRAM package 18, and the controller package may differ in type from one another. For example, the QFPs may be used as the NAND package 17 and the DRAM package 18 while the COB may be used as the controller package.

The above-described components are proposed by way of example; in other embodiments, some of the above-described components may be omitted, and different combinations that may include different components may be implemented.

Through-holes 13B are provided in the circuit board 13, and through-holes 14C are provided in the circuit board 14. The screws 6B can be respectively inserted into the through-holes 13B. The screws 6C can be respectively inserted into the through-holes 14C. The through-holes 13B can be respectively disposed at each of four corners of the circuit board 13, and the through-holes 14C can be respectively disposed at each of four corners of the circuit board 14. Implementing the screws can provide for detachably attaching (e.g. screwing) some of the above described components to each other.

The pins of the connector on the bottom surface of the circuit board 13 are inserted into the pin holes P1 of the connector 24 on the top surface of the circuit board 14. The screws 6C are respectively inserted into the screw holes 2C via the through-holes 14C, which can help to fix the circuit board 14 to the bottom plate 2. The screws 6B are respectively inserted into the screw holes 2B via the through-holes 13B, which can help to fix the circuit board 13 to the bottom plate 2. The screws 6A are respectively inserted into the screw holes 2A via the through-holes 1D, which can help to fix the top plate 1 to the bottom plate 2.

Setting the formation surface of each screw hole 2A higher than that of each screw hole 2B and setting the formation surface of each screw hole 2B higher than that of each screw hole 2C can keep a clearance between the bottom plate 2 and the circuit board 14, a clearance between the circuit board 14 and the circuit board 13, and a clearance between the circuit board 13 and the top plate 1 constant.

Heat dissipation sheets 7A can be provided between the circuit board 14 and the bottom plate 2. The heat dissipation sheets 7A can contact the controller package and the NAND package 17 on the bottom surface of the circuit board 14. A thermally conductive and elastic material may be implemented in the heat dissipation sheets 7A, and an acrylic resin, for example, can be used therefor.

As shown in FIG. 2A, the NAND package 17 is mounted on the circuit board 12. One or more NAND packages 17 can be mounted on both top and bottom surfaces of the circuit board 12.

The DRAM package 18, an electronic component 23, and the capacitor 19 are also mounted on the top surface of the circuit board 12. The connector T1 is mounted at a front portion of the circuit board 12. The electronic component 23 can constitute at least a portion of a power supply circuit or the like. The controller package is mounted on the bottom surface of the circuit board 12.

Furthermore, through-holes 12C are provided in the circuit board 12. The screws 6C can be respectively inserted into the through-holes 12C. The through-holes 12C can be respectively disposed at each of four corners of the circuit board 12.

A rib 11A is provided on the intermediate plate 11. The rib 11A can enhance rigidity of the intermediate plate 11. The rib 11A can project toward the top plate 1. The rib 11A can be disposed along a flow of the air flow AF. For example, the rib 11A can extend from a rear end portion to a front end portion of the intermediate plate 11. Metal such as aluminum (Al) or copper (Cu) can be used as a material for the intermediate plate 11. To increase a contact area of the intermediate plate 11 with the air flow AF, surfaces of the intermediate plate 11 may be embossed or micropores may be provided in the surfaces of the intermediate plate 11.

Moreover, through-holes 11B are provided in the intermediate plate 11. The screw 6B can be respectively inserted into the through-holes 11B. The through-holes 11B can be respectively disposed at each of four corners of the intermediate plate 11. Positions of the through-holes 11B can be made correspond to those of the through-holes 13B of the circuit board 13. Further, a notch portion 11C that defines a notch can be provided in the intermediate plate 11 to correspond to a position of the capacitor 19 (e.g. such that the capacitor 19 may protrude above the intermediate plate 11).

The screws 6C are respectively inserted into the screw holes 2C via the through-holes 12C, thereby helping to fix the circuit board 12 to the bottom plate 2. The screws 6B are respectively inserted into the screw holes 2B via the through-holes 11B, thereby helping to fix the intermediate plate 11 to the bottom plate 2. The screws 6A are respectively inserted into the screw holes 2A via the through-holes 1D, thereby helping to fix the top plate 1 to the bottom plate 2.

Setting the formation surface of each screw hole 2A higher than that of each screw hole 2B and setting the formation surface of each screw hole 2B higher than that of each screw hole 2C can keep a clearance between the bottom plate 2 and the circuit board 12, a clearance between the circuit board 12 and the intermediate plate 11, and a clearance between the intermediate plate 11 and the top plate 1 constant.

Providing the clearances between the circuit board 12 and the intermediate plate 11 and between the intermediate plate 11 and the top plate 1 can ensure smooth flow of the air flow AF within the electronic apparatus E1. It is, therefore, possible to efficiently cool the circuit board 12, the intermediate plate 11, and the top plate 1.

The heat dissipation sheets 7A can be provided between the circuit board 12 and the bottom plate 2. The heat dissipation sheets 7A can contact the controller package and the NAND package 17 on the bottom surface of the circuit board 12. Heat dissipation sheets 7B can be provided between the circuit board 12 and the intermediate plate 11. The heat dissipation sheets 7B can contact the NAND package 17 and the DRAM package 18 on the top surface of the circuit board 12, and the bottom surface of the intermediate plate 11. Heat dissipation sheets 7C can be provided between the intermediate plate 11 and the top plate 1. The heat dissipation sheets 7C can contact the rib 11A of the intermediate plate 11 and the recess portions 1B of the top plate 1.

Thus, if one circuit board 12 is provided in the electronic apparatus E1 as an alternative to the two circuit boards 13 and 14, providing the intermediate plate 11 on the circuit board 12 allows the heat generated in the circuit board 12 to be routed to the top plate 1, so that it is unnecessary to set the height of the electronic apparatus E1 to be small. Therefore, it is unnecessary to change the height H1 of the electronic apparatus E1 and the electronic apparatus E1 can be configured to comply with the SFF standards.

Furthermore, providing the intermediate plate 11 on the circuit board 12 can provide for a heat dissipation path from the circuit board 12 to the top plate 1 without changing a configuration of the top plate 1. This can help to improve cooling efficiency for cooling the circuit board while using a same or similar top plate 1 in implementations in which the two circuit boards 13 and 14 are provided in the electronic apparatus E1, and in implementations in which one circuit board 12 is provided therein.

Moreover, providing the intermediate plate 11 on the circuit board 12 allows the intermediate plate 11 to act as a shock-absorber. This can help to suppress deformation or displacement of the circuit board 12 and improve the shock resistance of the electronic apparatus E1.

Furthermore, providing the rib 11A on the intermediate plate 11 can increase the contact area between the intermediate plate 11 and the air flow AF while improving the rigidity of the intermediate plate 11, thereby helping to improve a cooling capability and the shock resistance of the electronic apparatus E1.

Moreover, making the positions of the through-holes 11B of the intermediate plate 11 correspond to those of the through-holes 13B of the circuit board 13 allows implementing the same or similar screw holes 2B and screws 6B in implementations that include the two circuit boards 13 and 14 and in implementations that include the single circuit board 12 in the electronic apparatus E1.

Figure 3:
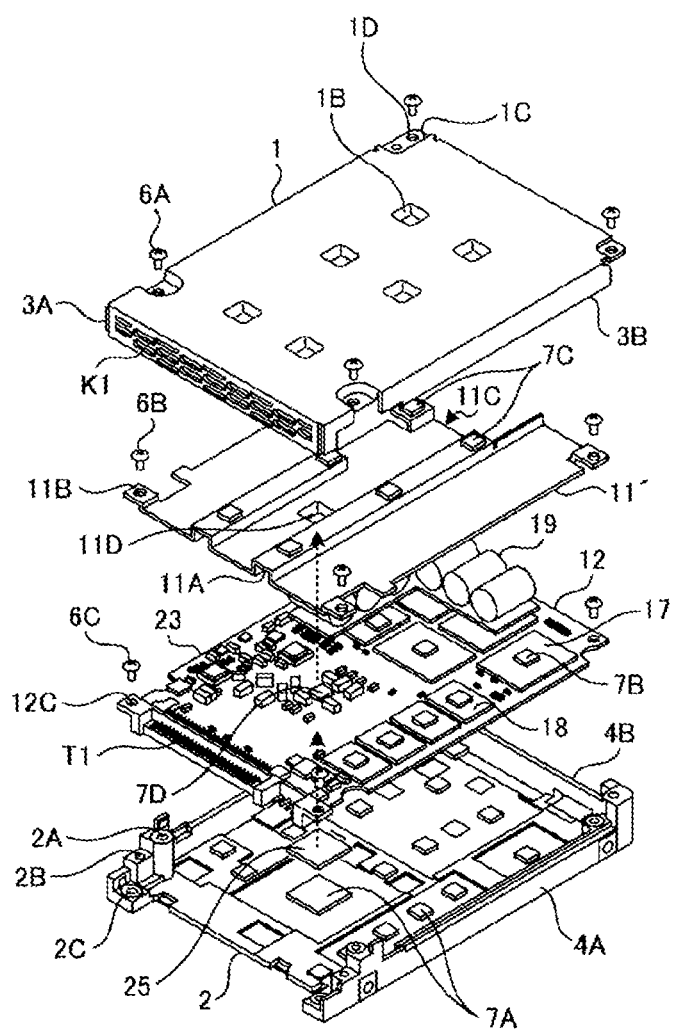
FIG. 3 is an exploded perspective view illustrating another example of the configuration of the electronic apparatus shown in FIG. 1 when one circuit board is implemented in the electronic apparatus.

FIG. 3 is an exploded perspective view illustrating another example of the configuration of the electronic apparatus shown in FIG. 1 when one circuit board is implemented in the electronic apparatus. As shown in FIG. 3, a controller package 25 can be mounted on the bottom surface of the circuit board 12. A heat dissipation sheet 7D is provided on the top surface of the circuit board 12. A position of the heat dissipation sheet 7D can be made correspond to that of the controller package 25. Furthermore, with the configuration shown in FIG. 3, an intermediate plate 11' can be provided as an alternative to the intermediate plate 11 shown in FIG. 2A. A recess portion 11D can be provided in, and defined by, the intermediate plate 11'. A position of the recess portion 11D can be made correspond to that of the heat dissipation sheet 7D. The configuration shown in FIG. 3 is the same as, or similar to, that shown in FIG. 2A in other respects.

Here, the screws 6B respectively are inserted into the screw holes 2B via the through-holes 11B, thereby helping to fix the intermediate plate 11' to the bottom plate 2. When the intermediate plate 11' is fixed to the bottom plate 2, the recess portion 11D of the intermediate plate 11' can receive the heat dissipation sheet 7D.

At this time, heat generated in the controller package 25 can be routed from a bottom surface side of the controller package 25 in a route of the controller package 25→the heat dissipation sheet 7A→the bottom plate 2. The heat generated in the controller package 25 can be also be routed from a top surface side of the controller package 25 in a route of the controller package 25→the circuit board 12→the heat dissipation sheet 7D→the intermediate plate 11'→the rib 11A→the heat dissipation sheets 7C→the top plate 1. Therefore, it is possible to efficiently release the heat generated in the controller package 25 from both surfaces of the controller package 25 without changing the configurations of the top plate 1 and the bottom plate 2, and to improve the cooling capability of cooling the controller package 25.

(Second Aspect)

Figure 4:
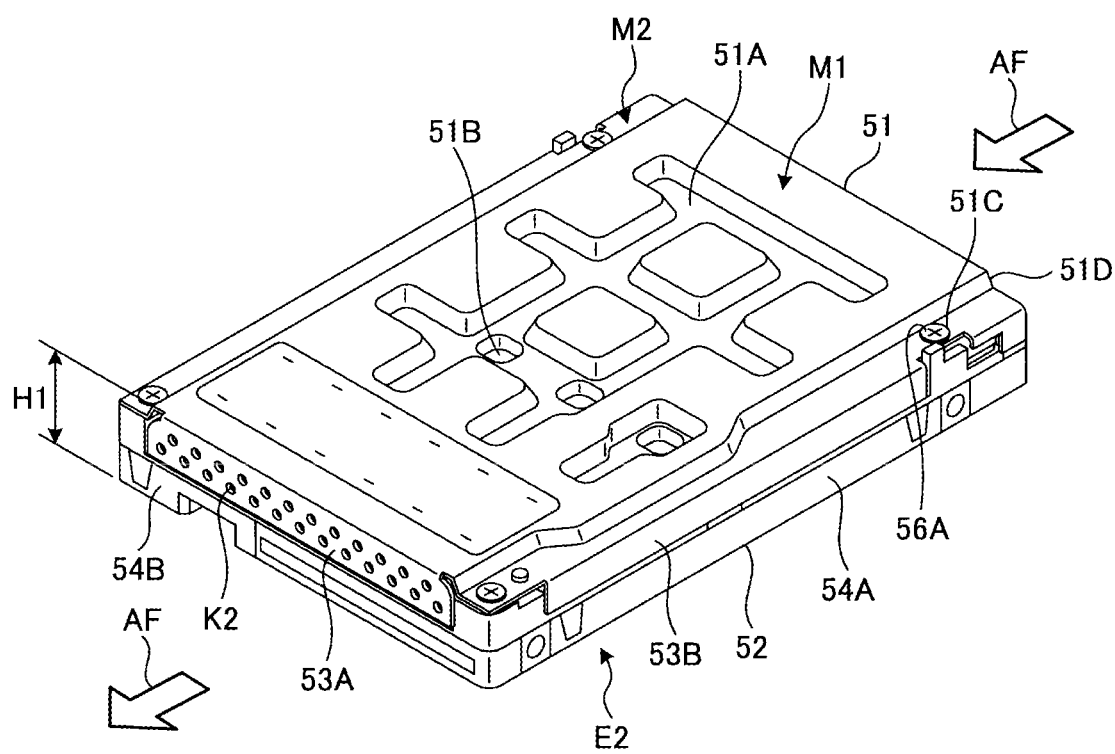
FIG. 4 is a perspective view illustrating a schematic configuration of some embodiments of an electronic apparatus viewed from a top plate side according to a second embodiment.

FIG. 4 is a perspective view illustrating a schematic configuration of some embodiments of an electronic apparatus viewed from a top plate side according to a second aspect. FIG. 5 is an exploded perspective view illustrating an example of a configuration of the electronic apparatus shown in FIG. 4 when one circuit board is implemented in the electronic apparatus.

As shown in FIG. 4 and FIG. 5, an electronic apparatus E2 includes a top plate 51 and a bottom plate 52. As shown in FIG. 5, an intermediate plate 61 and a circuit board 62 can be provided between the top plate 51 and the bottom plate 52. The intermediate plate 61 can be fixed to a bottom surface of, or can constitute a bottom surface of, the top plate 51.

Side plates 53A and 53C are provided on front and rear ends of the top plate 51, and side plates 53B are provided on right and left ends of the top plate 51, respectively. Vent holes K2 are provided in the side plate 53A, and vent holes K3 are provided in the side plate 53C. Side plates 54A are provided on right and left ends of the bottom plate 52, respectively, and a side plate 54B is provided on a rear end of the bottom plate 52. The top plate 51, the bottom plate 52, and the side plates 53A, 53B, 53C, 54A, and 54B can surround the intermediate plate 61 and the circuit board 62.

Furthermore, a rib 51A, recess portions 51B, and stepped portions 51D are provided on the top plate 51. The rib 51A may be recessed from a top surface of the top plate 51, and the recess portion 51B may be a further recessed portion of the rib 51A. The rib 51A can enhance rigidity of the top plate 51. The rib 51A can be configured to project from the top plate 51 toward the bottom plate 52. The recess portions 51B can be used as part of a heat dissipation path of heat generated in the circuit board 62, and can project from the top plate 51 toward the bottom plate 52. The stepped portions 51D can be provided in outer edge portions of the top plate 51, and can connect a central surface M1 (as shown in FIG. 4) of the top plate 51 and outer surfaces M2 (as shown in FIG. 4) of the top plate 51 that are disposed below (recessed from) the top surface of the plate 51. Through-holes 51C are provided in the surfaces M2 of the top plate 51. Screws 56A can be respectively inserted into the through-holes 51C.

The height H1 of the electronic apparatus E2 can be defined by a vertical distance from a bottom surface of the bottom plate 52 to a top surface of the top plate 51. The height H1 of the electronic apparatus E2 can comply with the SFF standards. Disposing the through-holes 51C in the surfaces M2 of the top plate 51 can prevent a head part of the screws 56A from projecting to a higher position than that of the surface M1, and allows the height H1 of the electronic apparatus E2 to comply with the SFF standards.

The air flow AF flows into the electronic apparatus E2 via the vent holes K3 and flows out from an interior of the electronic apparatus E2 via the vent holes K2, whereby it is possible to efficiently cool the interior of the electronic apparatus E2.

As shown in FIG. 5, side plates 61A and a fixing plate 61B are provided on the intermediate plate 61. A notch portion 61E that defines a notch is provided in the intermediate plate 61 to correspond to a position of a capacitor 69. Metal such as aluminum or copper can be used as a material for the intermediate plate 61, the side plates 61A, and the fixing plate 61B. The intermediate plate 61, the side plates 61A, the fixing plate 61B, and the notch portion 61E can be formed integrally from one flat metal plate by such a method as pressing.

Furthermore, a rib 61C and a projecting portion 61D are provided on the intermediate plate 61. The rib 61C can enhance rigidity of the intermediate plate 61. The rib 61C can be configured to project from the intermediate plate 61 toward the top plate 51. The projecting portion 61D can be configured to project from the intermediate plate 61 toward the circuit board 62. The projecting portion 61D can be used as part of a heat dissipation path of heat generated in the circuit board 62.

The intermediate plate 61 is fixed to a bottom surface of the top plate 51 via the fixing plate 61B. The fixing can be made by caulking, for example. Alternatively, the fixing can be made using such a method as welding. To increase a contact area of the intermediate plate 61 with the air flow AF, surfaces of the intermediate plate 61 may be embossed or micropores may be provided in the surfaces of the intermediate plate 61.

Here, when the intermediate plate 61 is fixed to the bottom surface of the top plate 51, a certain clearance can be kept between the intermediate plate 61 and the top plate 51. The clearance between the intermediate plate 61 and the top plate 51 can constitute at least a portion of a vent path of the air flow AF. The side plates 61A can be disposed at positions at which the side plates 61A do not hinder the flow of the air flow AF.

Screw holes 52A through 52C are provided in the bottom plate 52. The screw holes 52A through 52C can be disposed at each of four corners of the bottom plate 52. A formation surface of the screw hole 52A can be set higher than that of each screw hole 52B, and the formation surface of each screw hole 52B can be set higher than that of each screw hole 52C. Screws 56A can be respectively inserted into the screw holes 52A. Screws 56C can be respectively inserted into the screw holes 52C. When the intermediate plate 61 is fixed to the top plate 51, each screw hole 52B may be closed with a seal 52D.

If the intermediate plate 61 is provided, the screw holes 52B may be omitted from the bottom plate 52. The bottom plate 52 can be used both in implementations where the intermediate plate 61 is provided and in implementations where a circuit board is used as an alternative to the intermediate plate 61. The screw holes 52B may not have screws inserted (e.g. may be left unfilled) in implementations in which the intermediate plate 61 is provided, and the screw holes 52B may have screws inserted in implementations in which the circuit board is used as an alternative to the intermediate plate 61.

A NAND package 67 is mounted on the circuit board 62. One or more NAND packages 67 can be mounted on both top and bottom surfaces of the circuit board 62. A DRAM package 68, an electronic component 70, and a capacitor 69 are also mounted on the top surface of the circuit board 62. A connector T2 is mounted at a rear end portion of the circuit board 62. The electronic component 70 can constitute at least a portion of a power supply circuit or the like. A controller package (not shown) is mounted on the bottom surface of the circuit board 62.

Furthermore, through-holes 62C are provided in the circuit board 62. Screws 56C can be respectively inserted into the through-holes 62C. The through-holes 62C can be respectively disposed at each of four corners of the circuit board 62.

The screws 56C are respectively inserted into the screw holes 52C via the through-holes 62C, thereby helping to fix the circuit board 62 to the bottom plate 52. The screws 56A are respectively inserted into the screw holes 52A via the through-holes 51C, thereby helping to fix the top plate 51 to the bottom plate 52.

Setting the formation surface of each screw hole 52A higher than that of each screw hole 52C and setting a difference in height between the formation surface of the screw hole 52A and that of the screw hole 52C greater than a difference in height between the intermediate plate 61 and each surface M2 of the top plate 51 can keep a clearance between the bottom plate 52 and the circuit board 62 and a clearance between the circuit board 62 and the intermediate plate 61 constant.

Providing the clearances between the circuit board 62 and the intermediate plate 61 and between the intermediate plate 61 and the top plate 51 can ensure smooth flow of the air flow AF within the electronic apparatus E2. It is, therefore, possible to efficiently cool the circuit board 62, the intermediate plate 61, and the top plate 51.

Heat dissipation sheets 57A can be provided between the circuit board 62 and the bottom plate 52. The heat dissipation sheets 57A can contact the controller package and the NAND package 67 on the bottom surface of the circuit board 62. The heat dissipation sheets 57A can also be used for other heating members on the bottom surface of the circuit board 62. Heat dissipation sheets 57B can be provided between the circuit board 62 and the intermediate plate 61. The heat dissipation sheets 57B can contact the NAND package 67 and the DRAM package 68 on the top surface of the circuit board 62, and the projecting portion 61D of the intermediate plate 61. The heat dissipation sheets 57B can also be used for other heating members on the top surface of the circuit board 62.

Here, if one circuit board 62 is provided in the electronic apparatus E2 as an alternative to the two circuit boards, providing the intermediate plate 61 on the circuit board 62 allows the heat generated in the circuit board 62 to be routed to the top plate 51, so that it is unnecessary to set the height of the electronic apparatus E2 to be small. It is thus unnecessary to change the height H1 of the electronic apparatus E2 and the electronic apparatus E2 can be configured to comply with the SFF standards.

Furthermore, fixing the intermediate plate 61 to the bottom side of the top plate 51 can provide for an alternative to fixing the intermediate plate 61 to the bottom plate 52 by such a method as screwing and can, therefore, facilitate mounting the intermediate plate 61.

Moreover, fixing the intermediate plate 61 to the bottom side of the top plate 51 allows the intermediate plate 61 to act as a shock-absorber. This can help to suppress deformation of the circuit board 62 and improve the shock resistance of the electronic apparatus E2.

Furthermore, providing the rib 61C on the intermediate plate 61 can increase the contact area between the intermediate plate 61 and the air flow AF while improving the rigidity of the intermediate plate 61, thereby helping to improve a cooling capability and the shock resistance of the electronic apparatus E2. Configuring the rib 61C to project from the intermediate plate 61 toward the top plate 51 can bring the NAND package 67 and the DRAM package 68 on the circuit board 62 into contact with the heat dissipation sheets 57B without hindrance of the rib 61C.

While the SSD is described as the electronic apparatus in the abovementioned embodiments, the electronic apparatus is not limited to the SSD. For example, the electronic apparatus may include an HDD (Hard Disk Drive), a computer or a communication apparatus.

As used herein, directional terms such as "up", "down", "left", "right," "top," "bottom," "on," "under," "over," "below," "vertical," "front," and "rear" are used to refer to an orientation shown in the drawings. The embodiments described herein may be implemented in a different orientation than is shown in the drawings.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure, and various embodiments described herein can be combined. The accompanying claims and their equivalents are intended to cover such forms or modifications as would fall within the scope and spirit of the present disclosure.

What is claimed is:

1. An electronic apparatus, comprising:
 a top plate;
 a bottom plate provided under the top plate;
 a circuit board provided between the top plate and the bottom plate;
 an intermediate plate provided between the top plate and the circuit board and configured to provide a first open-ended clearance between the top plate and the intermediate plate;
 an electronic component, disposed on the circuit board, that comprises a capacitor or a battery,
 wherein the intermediate plate defines a notch corresponding to a position of the capacitor or the battery, and
 wherein the intermediate plate comprises a rib extending from a first end portion of the intermediate plate to a second end portion of the intermediate plate.

2. The electronic apparatus according to claim 1, wherein the intermediate plate is further configured to allow an air flow from a first end portion of the top plate to a second end portion of the top plate.

3. The electronic apparatus according to claim 2, wherein the rib is provided along a direction of the air flow.

4. The electronic apparatus according to claim 2, wherein a length of the rib is the same as a distance between the first end portion of the top plate and the second end portion of the top plate.

5. The electronic apparatus according to claim 4, wherein the first end portion of the top plate is above the first end portion of the intermediate plate, and the second end portion of the top plate is above the second end portion of the intermediate plate.

6. The electronic apparatus according to claim 5, wherein the first end portion of the top plate is aligned with the first end portion of the intermediate plate, and the second end portion of the top plate is aligned with the second end portion of the intermediate plate.

7. The electronic apparatus according to claim 1, further comprising a screw, and wherein
 the intermediate plate is detachably attached to the bottom plate by the screw.

8. The electronic apparatus according to claim 1, wherein the intermediate plate is a metal plate.

9. The electronic apparatus according to claim 8, further comprising a screw, and wherein
 the intermediate plate is detachably attached to the bottom plate by the screw.

10. The electronic apparatus according to claim 1, further comprising
 a connector disposed on a first end portion of the circuit board.

11. The electronic apparatus according to claim 10, wherein the electronic component is disposed on a second end portion of the circuit board.

12. The electronic apparatus according to claim 11, wherein
   the first end portion of the intermediate plate is aligned with the first end portion of the circuit board and the second end portion of the intermediate plate is aligned with the second end portion of the circuit board.

13. The electronic apparatus according to claim 1, wherein
   the first end portion of the intermediate plate is aligned with a first end portion of the circuit board and the second end portion of the intermediate plate is aligned with a second end portion of the circuit board.

14. The electronic apparatus according to claim 1, wherein the intermediate plate is further configured to provide a second open-ended clearance between the circuit board and the intermediate plate.

\* \* \* \* \*